US008080469B2

(12) United States Patent
Hirai et al.

(10) Patent No.: US 8,080,469 B2
(45) Date of Patent: Dec. 20, 2011

(54) METHOD FOR INCREASING THE AREA OF NON-POLAR AND SEMI-POLAR NITRIDE SUBSTRATES

(75) Inventors: Asako Hirai, Santa Barbara, CA (US); James S. Speck, Goleta, CA (US); Steven P. DenBaars, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 536 days.

(21) Appl. No.: 12/234,340

(22) Filed: Sep. 19, 2008

(65) Prior Publication Data

US 2009/0072353 A1   Mar. 19, 2009

Related U.S. Application Data

(60) Provisional application No. 60/973,656, filed on Sep. 19, 2007.

(51) Int. Cl.
*H01L 21/28* (2006.01)
(52) U.S. Cl. ........................ 438/604; 257/615
(58) Field of Classification Search ............ 257/615; 438/604
See application file for complete search history.

(56) References Cited

U.S. PATENT DOCUMENTS

| 6,316,785 | B1 | 11/2001 | Nunoue et al. |
| 7,118,813 | B2 | 10/2006 | Xu et al. |
| 7,220,324 | B2 | 5/2007 | Baker et al. |
| 7,727,874 | B2 * | 6/2010 | Hanser et al. ............ 438/604 |
| 2002/0144645 | A1 | 10/2002 | Kim et al. |
| 2003/0024475 | A1 | 2/2003 | Anderson |
| 2005/0142391 | A1 | 6/2005 | Dmitriev et al. |
| 2005/0161697 | A1 | 7/2005 | Nakahata et al. |
| 2005/0258451 | A1 | 11/2005 | Saxler et al. |
| 2007/0019177 | A1 | 1/2007 | Van Buel et al. |

OTHER PUBLICATIONS

Shao, Y-P. et al., "Electrical Characterization of Semipolar Gallium Nitride Thin Films," NNIN REU Research Accomplishments, Aug. 2005, pp. 132-133.
International Search Report mailed Dec. 5, 2008, International application No. PCT/US2008/077072, International filing date Sep. 19, 2008.

* cited by examiner

*Primary Examiner* — Douglas Menz
(74) *Attorney, Agent, or Firm* — Gates & Cooper LLP (57) ABSTRACT

A method for fabricating a high quality freestanding nonpolar and semipolar nitride substrate with increased surface area, comprising stacking multiple films by growing the films one on top of each other with different and non-orthogonal growth directions.

24 Claims, 5 Drawing Sheets

METHOD FOR INCREASING THE AREA OF NON-POLAR AND SEMI-POLAR NITRIDE SUBSTRATES

CROSS-REFERENCE TO RELATED APPLICATIONS

This application claims the benefit under 35 U.S.C. Section 119(e) of co-pending and commonly-assigned U.S. Provisional Patent Application Ser. No. 60/973,656, filed on Sep. 19, 2007, Asako Hirai, James S. Speck, Steven P. DenBaars, and Shuji Nakamura, entitled "METHOD FOR INCREASING THE AREA OF NONPOLAR AND SEMIPOLAR NITRIDE SUBSTRATES", which application is incorporated by reference herein.

BACKGROUND OF THE INVENTION

1. Field of the Invention

This invention relates to a technique for the production of large area, high quality freestanding (FS) nonpolar and semipolar nitride substrates.

2. Description of the Related Art

The usefulness of gallium nitride (GaN), and its ternary and quaternary compounds incorporating aluminum and indium (AlGaN, InGaN, AlInGaN), has been well established for fabrication of visible and ultraviolet optoelectronic devices and high-power electronic devices. These compounds are referred to herein as Group III nitrides, or III-nitrides, or just nitrides, or by (Al,Ga,In)N, or by $Al_{(1-x-y)}In_yGa_xN$ where $0 \leq x \leq 1$ and $0 \leq y \leq 1$. These devices are typically grown epitaxially using growth techniques including molecular beam epitaxy (MBE), metalorganic chemical vapor deposition (MOCVD), and hydride vapor phase epitaxy (HVPE).

GaN and its alloys are most stable in the hexagonal würtzite crystal structure, in which the structure is described by two (or three) equivalent basal plane axes that are rotated 120° with respect to each other (the a-axes), all of which are perpendicular to a unique c-axis. Group III and nitrogen atoms occupy alternating c-planes along the crystal's c-axis. The symmetry elements included in the würtzite structure dictate that III-nitrides possess a bulk spontaneous polarization along this c-axis, and the würtzite structure exhibits inherent piezoelectric polarization.

Current nitride technology for electronic and optoelectronic devices employs nitride films grown along the polar c-direction. However, conventional c-plane quantum well structures in III-nitride based optoelectronic and electronic devices suffer from the undesirable quantum-confined Stark effect (QCSE), due to the existence of strong piezoelectric and spontaneous polarizations. The strong built-in electric fields along the c-direction cause spatial separation of electrons and holes that in turn give rise to restricted carrier recombination efficiency, reduced oscillator strength, and red-shifted emission.

One approach to eliminating the spontaneous and piezoelectric polarization effects in GaN optoelectronic devices is to grow the devices on nonpolar planes of the crystal. Such planes contain equal numbers of Ga and N atoms and are charge-neutral. Furthermore, subsequent nonpolar layers are equivalent to one another so the bulk crystal will not be polarized along the growth direction. Two such families of symmetry-equivalent nonpolar planes in GaN are the {11-20} family, known collectively as a-planes, and the {10-10} family, known collectively as m-planes. Unfortunately, in spite of advances made by researchers in nitride community, heteroepitaxial growth of high quality nonpolar and semipolar GaN and high performance device fabrication remain challenging and have not yet been widely adopted in the III-nitride industry. On the other hand, despite the success in high performance devices homoepitaxially grown on high quality nonpolar and semipolar freestanding (FS) GaN substrates, the narrow substrate area makes it challenging to widely adopt into the III-nitride industry.

The other cause of polarization is piezoelectric polarization. This occurs when the material experiences a compressive or tensile strain, as can occur when (Al, In, Ga, B)N layers of dissimilar composition (and therefore different lattice constants) are grown in a nitride heterostructure. For example, a thin AlGaN layer on a GaN template will have in-plane tensile strain, and a thin InGaN layer on a GaN template will have in-plane compressive strain, both due to lattice matching to the GaN. Therefore, for an InGaN quantum well on GaN, the piezoelectric polarization will point in the opposite direction than that of the spontaneous polarization of the InGaN and GaN. For an AlGaN layer lattice matched to GaN, the piezoelectric polarization will point in the same direction as that of the spontaneous polarization of the AlGaN and GaN.

The advantage of using nonpolar or semipolar planes over c-plane nitrides is that the total polarization will be zero (nonpolar) or reduced (semipolar). There may even be zero polarization for specific alloy compositions on specific planes, for example, semipolar planes. The present invention satisfies the need for enhanced area nonpolar and semipolar substrates.

SUMMARY OF THE INVENTION

To overcome the limitations in the prior art described above, and to overcome other limitations that will become apparent upon reading and understanding the present specification, the present invention describes a technique for the production of large area and high quality FS nonpolar and semipolar nitride substrates via multiple slicing and growth steps. One novel feature comprises geometrically increasing the available surface area of nonpolar or semipolar substrates by changing the growth direction of thick-film growth steps.

The present invention discloses a method for fabricating a nonpolar or semipolar III-nitride substrate with increased surface area, comprising (a) growing III-nitride on a first plane of a FS III-nitride substrate, wherein the III-nitride is nonpolar or semipolar, the first plane is a nonpolar or semipolar plane, and the FS III-nitride substrate has a typical thickness of more than 500 microns, and (b) slicing or polishing the III-nitride along a second plane to obtain a top surface of the III-nitride which is the second plane, wherein the III-nitride substrate comprises the III-nitride with the top surface and the second plane is a nonpolar plane or semipolar plane. For example, the first plane may be a semipolar plane and the second plane may be a nonpolar plane.

In one embodiment the first plane is a sliced surface of the FS III nitride substrate, the sliced surface is at a first angle with respect to a c-plane and determines a growth direction of the III-nitride, and a width of the sliced surface is a thickness of the first substrate divided by a sine of the first angle. For example, the FS III-nitride substrate is sliced at the first angle from the FS III-nitride, wherein the FS III-nitride has a c-orientation and the c-plane is a surface of the FS III-nitride.

In another embodiment, the slicing or polishing of the III-nitride is at a second angle with respect to the first plane. In this case, a sum of the first angle and the second angle determines a crystallographic orientation of the top surface of the III-nitride substrate. For example, the sum may be 90 degrees in order to achieve m-plane orientations.

In yet another embodiment, the III-nitride and the FS III-nitride substrate is sliced or polished along the second plane, to obtain the III-nitride substrate including the III-nitride stacked on the FS III-nitride substrate and the top surface which includes the III-nitride and the FS III-nitride substrate.

A thickness of the III-nitride may be thicker than a thickness of a commercially available III-nitride substrate.

Typically, the second plane should be substantially non orthogonal to the first plane of the FS III-nitride substrate in order to enlarge a surface area of the second plane as compared to a surface area of the first plane. More specifically, if the second plane is selected to be a nonpolar plane, the growth direction should be non-orthogonal to the c-plane in order to enlarge a surface area of the second plane as compared to a surface area of a nonpolar plane which is orthogonal to the c-plane. Calculations show the second plane may be at least $2h_{MAX2}$ times larger than the surface area of the nonpolar plane which is orthogonal to the c-plane, where $h_{MAX2}$ is a thickness of the III-nitride.

The present invention further discloses a device fabricated using the method.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

Conventionally, nitride films are grown on 2-inch diameter substrates toward the c-direction. As bulk crystals of GaN are not yet available, it is not possible to simply cut a crystal to present an arbitrarily large surface for subsequent device regrowth. Currently, commercially available FS GaN substrates are pieces sliced from the thick films grown by HVPE towards the c-direction. The slice angle differs depending on the arbitrarily chosen crystal planes, i.e., horizontally (c-plane), vertically (nonpolar plane), or at an angle (semipolar plane) to the substrate surface, in the case of a c-plane GaN thick-film. Therefore, the substrate areas of FS nonpolar or semipolar GaN substrates are limited by the c-direction thickness of the grown crystal.

Growth of nonpolar and semipolar nitride semiconductors, for example, {10-10} and {11-20} (nonpolar m- and a-plane, respectively), and {10-11}, {10-13}, and {11-22} (semipolar) planes of GaN, offer a means of reducing polarization effects in würtzite-structure III-nitride device structures. Current nitride devices are grown in the polar [0001] c-direction, which results in a charge separation in quantum wells along the [0001] c-direction. The resulting polarization fields are detrimental to the performance of current state of the art optoelectronic devices. Growth of these devices along a nonpolar or semipolar direction could improve device performance significantly by reducing built-in electric fields along the conduction direction.

Until now, no means existed for preparing large area and high quality FS GaN substrates of nonpolar and semipolar nitrides suitable for use as substrates in device growth. The novel feature of the present invention is the new geometrical measure, with multiple growth steps, to increase the area of nonpolar and semipolar FS nitride substrates sliced out from the boule. The term "boule" term refers to the bulk crystal grown in a crystal direction other than the final crystal plane whose area has been enlarged using the present invention. For example, the present invention describes expanding the FS {10-10}, {11-20}, {10-11}, {10-13}, and {11-22} planes of a GaN substrate. However, the scope of the present invention is not limited to solely these examples. The present invention is relevant to all nitride nonpolar and semipolar planes.

Technical Description

The present invention combines various growth directions (crystal planes) of thick GaN growth, and subsequent slicing angles, to geometrically enlarge the surface area of a FS GaN substrate. It is quite uncommon in semiconductor growth to utilize multiple growth steps with different growth directions that are not orthogonal to the prior substrate surface, to enlarge the surface area of the final crystal plane.

The present invention calculates the estimated area enhancement for the examples shown in FIGS. 1(a)-(g) and FIGS. 2(a)-(g). Both cases deal with a two-step growth/slicing process, starting from defect reduced c-plane GaN growth (GaN-1) 100 on foreign substrates 102 to enlarge the final size of FS nonpolar GaN (GaN-3) 104, via semipolar GaN growth (GaN-2,2') 106, 108.

FIGS. 1(a)-(g) and FIGS. 2(a)-(g) illustrate a method for fabricating a nonpolar or semipolar III-nitride substrate 104 with increased surface area, comprising (a) growing III-nitride 108 on a first plane 110 of a freestanding (FS) III-nitride substrate 106, wherein the III-nitride 108 is nonpolar or semipolar, the first plane 110 is a nonpolar or semipolar plane, and the FS III-nitride substrate 106 typically has a thickness $h_S$ of more than 500 microns (although other thicknesses $h_S$ are possible), and (b) slicing or polishing the III-nitride 108 along a second plane 112 to obtain a top surface of the III-nitride 108 which is the second plane 112, wherein the III-nitride substrate 104 comprises the III-nitride 108 with the top surface and the second plane 112 is a nonpolar plane or semipolar plane.

In one embodiment, the nonpolar or semipolar plane 110 is a sliced surface 114 of the FS III-nitride substrate 106, the sliced surface 114 is at a first angle $\theta_1$ with respect one or more c-planes 116a, 116b and determines a growth direction 118 (i.e. semipolar direction, m-direction, or a-direction, for example) of the nonpolar or semipolar III-nitride 108, and a width $h_1$ of the sliced surface 114 is a thickness $h_{MAX1}$ of the FS III-nitride substrate 106 divided by a sine of the first angle $\theta_1$. The FS III-nitride substrate 106 might be sliced at the first angle $\theta_1$ out of FS III-nitride 100, wherein the FS III-nitride 100 has a c-orientation and the c-plane 116a, 116b is a surface 120a, 120b of the FS III-nitride 100.

In another embodiment, the slicing or polishing of the nonpolar or semipolar III-nitride 108 is at a second angle $\theta_2$ with respect to the nonpolar or semipolar plane 110 of the FS III-nitride 106.

In yet another embodiment, the III-nitride 108 and the FS III-nitride substrate 106 are sliced along the second plane 112, to obtain the III-nitride substrate 104 including the III-nitride 108 stacked on the FS III-nitride substrate 106 and the top surface which includes the III-nitride 108 and the FS III-nitride substrate 106.

Typically, the second plane 112 should be substantially non orthogonal to the first plane 110 of the FS III-nitride substrate 106 in order to enlarge a surface area of the second plane 112 as compared to a surface area of the first plane 110. More specifically, if the second plane 112 is selected to be a nonpolar plane, the growth direction 118 is substantially non-orthogonal to the c-plane 116b, 116a in order to enlarge a surface area of the second plane 112 as compared to a surface area of a nonpolar plane 122 which is orthogonal to the c-plane 116b, 116a. In fact, in the latter case, calculations show the second plane 112 can have a surface area $2h_{MAX2}$ times larger than the surface area of the nonpolar plane 122 which is orthogonal to the c-plane 116a, 116b (where $h_{MAX2}$ is a thickness of the semipolar III-nitride 108).

EXAMPLE 1

Figure 1A:
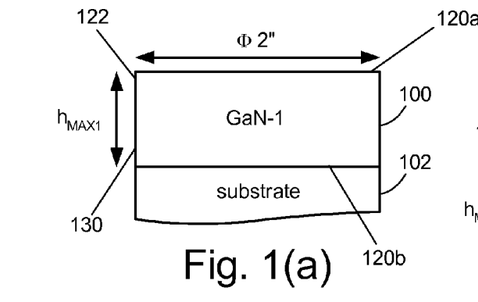
FIGS. 1(a), 1(b), 1(c), 1(d), 1(e), 1(f) and 1(g) are schematics illustrating an example of the two-step process flow starting from c-plane GaN (GaN-1), using semipolar GaN (GaN-2,2'), and resulting in a nonpolar FS substrate (GaN-3), wherein a numerical calculation to optimize the angle $\theta_1$, $\theta_2$ is illustrated by FIGS. 3(a)-(c).

FIGS. 1(a)-(g) illustrate the process steps according to a preferred embodiment of the present invention. These process steps comprise the following:

1. Thick c-plane GaN growth (GaN-1) 100, to a thickness of $h_{MAX1}$, on a substrate 102, as shown in FIG. 1(a), wherein $\Phi$ is the 2 inch diameter of the GaN-1 wafer 100.

Figure 1B:
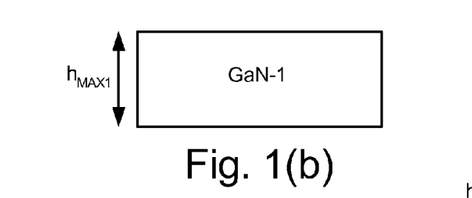

2. Substrate 102 removal, leaving a thickness $h_{MAX1}$ of c-plane GaN-1 100, as shown in FIG. 1(b).

3. Slicing a film 124 out of the c-plane GaN-1 100 along a semipolar plane 110 and at an angle $\theta_1$, as shown in FIG. 1(c), to form a sliced semipolar substrate GaN-2 106 having a surface 114 which is a semipolar plane 110 of width $h_1 = h_{MAX1}/\sin\theta_1$, as shown by FIG. 1(d) which is the top view of the sliced semipolar substrate GaN-2 106.

4. Growing a thickness $h_{MAX2}$ of semipolar GaN on the surface 114 of GaN-2 106 to form a semipolar growth GaN-2' 108 (i.e. growth in a semipolar direction 118 to achieve top surface 126a and bottom surface 126b of the GaN 108, wherein surfaces 126a, 126b are semipolar planes parallel to semipolar plane 110), as shown in FIG. 1(e).

5. Slicing the semipolar GaN growth GaN-2' 108 along a nonpolar plane 112 at an angle $\theta_2$, as shown in FIG. 1(f), resulting in a sliced substrate GaN-3 104, as shown in FIG. 1(g), which is the top view of the sliced substrate GaN-3 104. The sliced substrate GaN-3 104 has a top surface 128 which is a nonpolar plane 112 having a width $h_2 = h_{MAX2}/\sin\theta_2$.

Figure 1C:
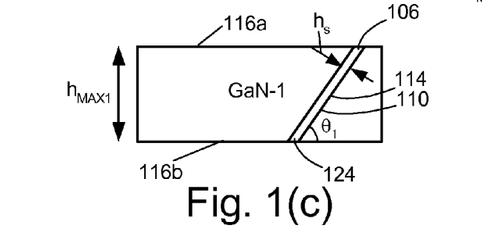
Figure 1D:
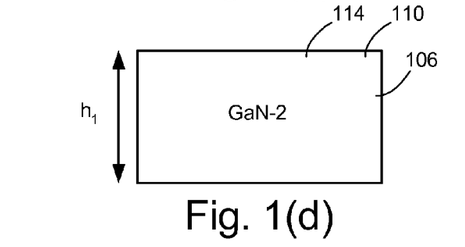
Figure 1E:
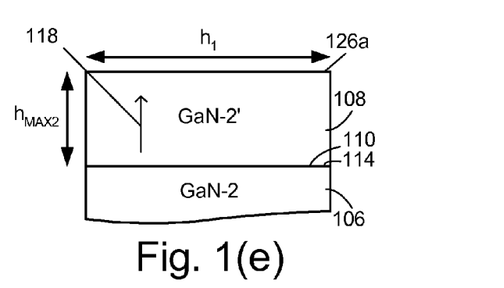
Figure 1F:
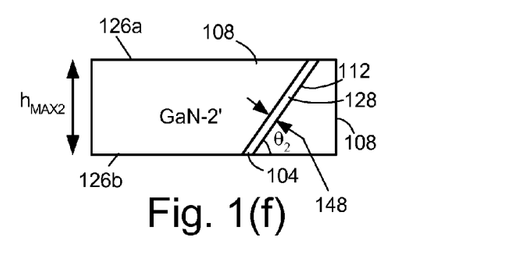
Figure 1G:
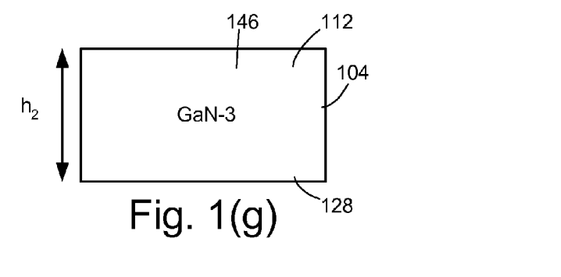

FIGS. 1(a)-(g) describe the case when the thickness $h_S$ of semipolar FS substrate 106 shown in FIG. 1(c) is in a normal thickness range of commercially available substrates, typically 250-400 μm. In this case, the area enlargement is expected to be roughly two-times as large as $h_{MAX2}$. For example, the area of surface 128, which is a nonpolar plane 112, is $2h_{MAX2}$ times larger than the area of nonpolar plane 122, wherein nonpolar plane 122 is a surface 130 which has not been prepared by slicing GaN-1 100 at an angle $\theta_1$, growing on surface 114 of GaN-2 106, and slicing GaN-2 108 at angle $\theta_2$.

The numerical calculation revealed that the maximum width $h_2$ of FS nonpolar GaN 104 in this case is about 8 mm when $h_{MAX1} = h_{MAX2} = 5$ mm, and the first slicing angle $\theta_1$ is chosen as a {10-11} semipolar plane 112 with slight miscut toward the <0001> c-direction (i.e. n~2), wherein n is a miller index of the semipolar plane denoted by {10-1n}.

EXAMPLE 2

Figure 2A:
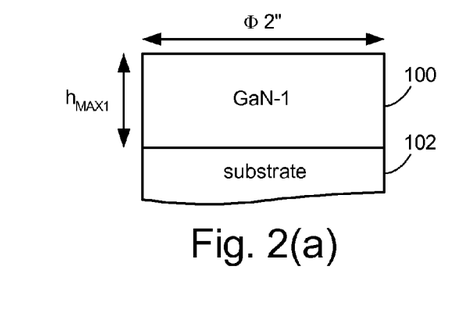
FIGS. 2(a), 2(b), 2(c), 2(d), 2(e), 2(f) and 2(g) are schematics illustrating another example of the two-step process flow starting from c-plane GaN (GaN-1), using semipolar GaN (GaN-2,2'), and resulting in a nonpolar FS-substrate (GaN-3), wherein a numerical calculation to optimize the angle $\theta_1$, $\theta_2$ is illustrated by FIG. 3(d).

FIGS. 2(a)-(g) also illustrate the process steps according to a preferred embodiment of the present invention. These process steps comprise the following:

1. Thick c-plane GaN growth (GaN-1) 100, to a thickness of $h_{MAX1}$, on a substrate 102, as shown in FIG. 2(a).

Figure 2B:
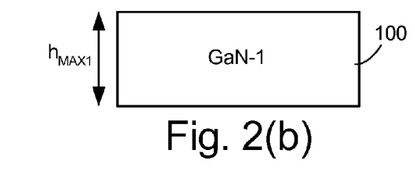

2. Substrate 102 removal, leaving a thickness $h_{MAX1}$ of c-plane GaN-1 100, as shown in FIG. 2(b).

Figure 2C:
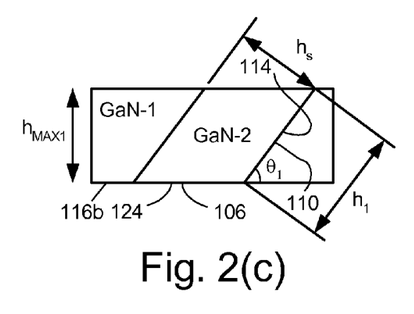
Figure 2D:
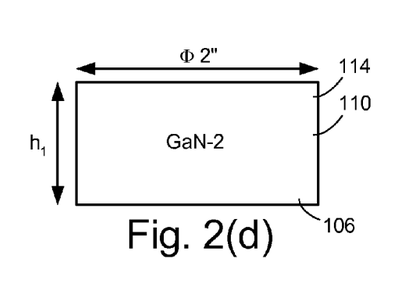

3. Slicing a film 124 out of the c-plane GaN-1 100 along a semipolar plane 110 at an angle $\theta_1$, as shown in FIG. 2(c), to form a sliced semipolar substrate GaN-2 106 having a surface 114 that is a semipolar plane 110 of width $h_1 = h_{MAX1}/\sin\theta_1$, as shown in FIG. 2(d), which is a top view of the sliced semipolar substrate GaN-2 106. The sliced semipolar substrate GaN-2 106 has a height $h_S$.

Figure 2E:
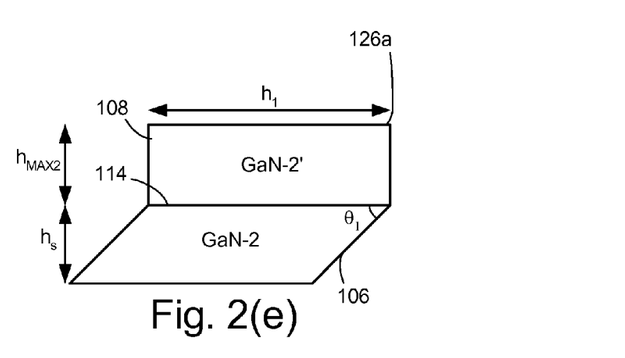

4. Growing a thickness $h_{MAX2}$ of semipolar GaN on the surface 114 (which is a semipolar plane 110) of GaN-2 106 to form a semipolar growth GaN-2' 108 (growth along a semipolar direction 118 to achieve top surface 126a which is a semipolar plane parallel to semipolar plane 110), as shown in FIG. 2(e).

Figure 2F:
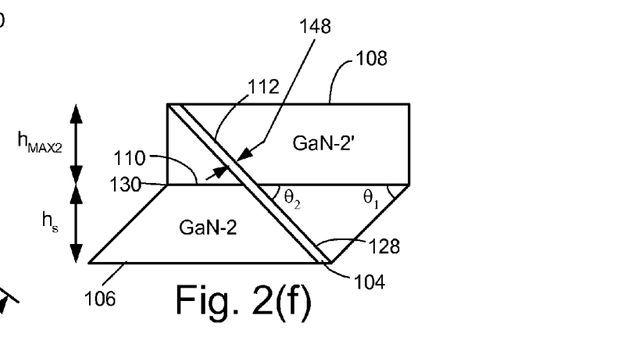
Figure 2G:
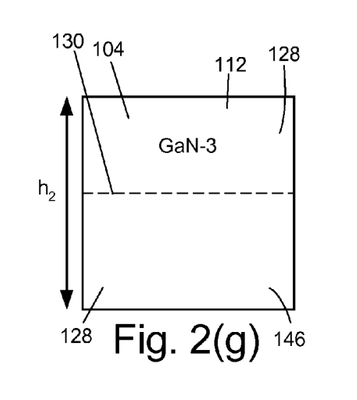

5. Slicing the semipolar GaN growth GaN-2' 108 and GaN-2 106 along a nonpolar plane 112 at an angle $\theta_2$, as shown in FIG. 2(f), resulting in a sliced substrate GaN-3 104, as shown in FIG. 2(g), which is a top view of the sliced substrate GaN-3 104. The sliced substrate GaN-3 104 has a surface 128 that is a nonpolar plane 112 having a width:

$h_2 = (h_{MAX2} + h_S)/\sin\theta_2$

FIG. 2(a)-(g) describes the case when the thickness $h_S$ of semipolar FS substrate 106 in FIG. 2(c) is larger than the thickness $h_S$ of the semipolar FS substrate 106 illustrated in FIG. 1(c) above, so that the final size (i.e. area of surface 128) of nonpolar GaN 104 in FIG. 2(g) is larger than the area of surface 128 illustrated in FIG. 1(g). The numerical calculation in Example 2 (see below) revealed that the maximum width $h_2$ of FS nonpolar GaN 104 in the FIG. 2(a)-(g) case is about 9 mm when $h_{max1} = h_{max2} = 5$ mm, which is wide enough for commercial device fabrication. Also shown in FIG. 2(g) is the homoepitaxial interface 130 between GaN 106 and GaN 108.

The most convenient growth method for the present invention would be HVPE, which is proven to produce a crystal with a low threading dislocation (TD) density (~$10^6$ cm$^{-2}$) without stacking faults when the growth direction is towards the c-direction, due to the annihilation of TDs during mm-thick growth.

The present invention is not limited to the examples shown in FIGS. 1(a)-(g) and FIG. 2(a)-(g). Additional growth steps involving other semipolar planes would further enlarge the size of final crystal plane 112. If the growth 108, 106 is nonpolar, along a nonpolar direction 118, then surfaces 114, 126a, 126b are nonpolar. The sapphire substrate 102 may be removed prior to the slicing step of FIG. 2(c), but FS-GaN substrate 106 is not removed prior to the slicing step of FIG. 2(f).

Numerical Calculations for Optimizing $\theta_1$ and $\theta_2$

Figure 3A:
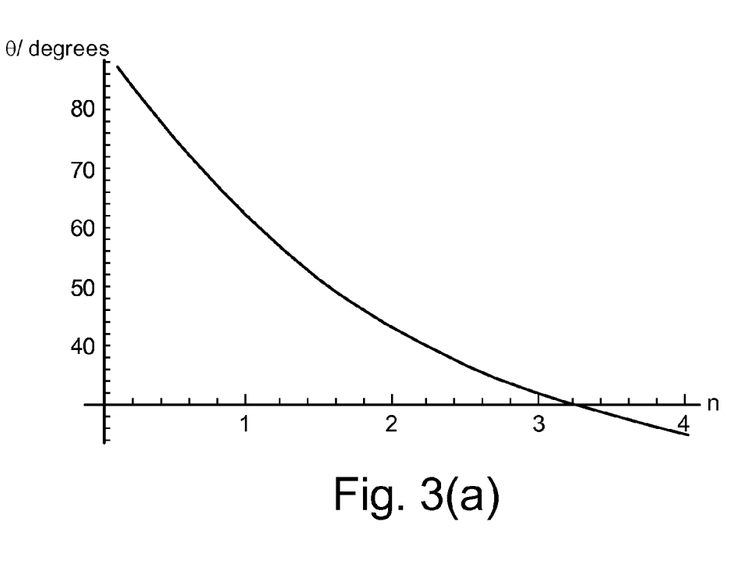
FIG. 3(a) plots the calculated angles θ (in degrees) of semipolar planes {10-1n} with respect to the basal plane, as a function of n, wherein θ=61.9434°, 43.1715°, 32.0226°, 25.1295°, and 20.5686° for n=1, 2, 3, 4 and 5, respectively, FIG. 3(b) plots $h_{2H}$ and $h_{2W}$ in units of millimeters (mm) for Example 1 and as a function of n, FIG. 3(c) plots $h_2$ in mm wherein $h_2=h_{2H}$ if $h_{2H} \leq h_{2W}$ and $h_2=h_{2W}$ if $h_{2H}>h_{2W}$ and as a function of n, and FIG. 3(d) plots the sample width $h_2$ in units of mm for Example 2, as a function of n, wherein $h_2$=7.35172 mm, 8.64655 mm, 9.2392 mm, and 9.52675 mm for n=1, 2, 3, and 4 respectively.

FIG. 3(a) plots the calculated angles $\theta$ of semipolar planes {10-1n}, as a function of n, wherein the slicing angle $\theta_1$ is chosen to be the $\theta$ for the selected semipolar plane 110, $\theta$ is an angle with respect to the basal plane which is a c-plane 116b of the GaN-1 100 (a basal plane is the plane which is perpendicular to the principal axis (c-axis) in a tetragonal or hexagonal structure) and $$\theta = \mathrm{ArcTan}\left[\frac{c_o/n}{\frac{\sqrt{3}}{2}a_o}\right], a_o = 3.191, \text{ and } c_o = 5.185.$$

Figure 3B:
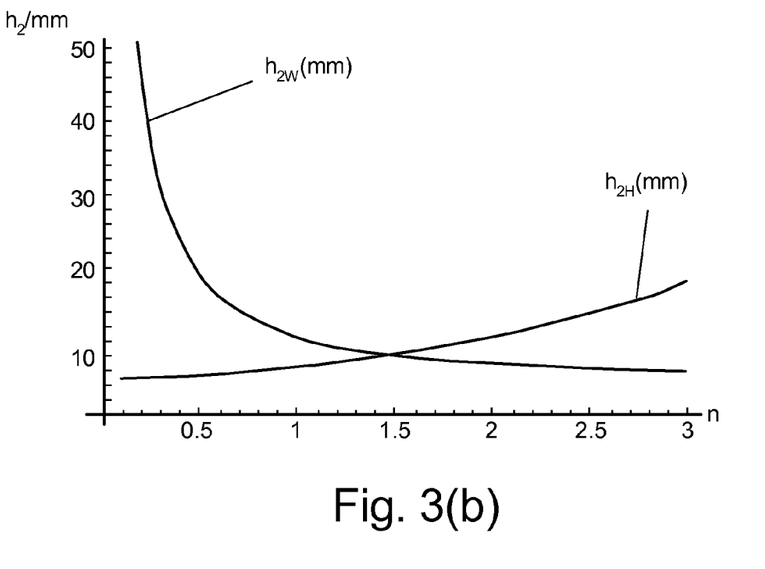
Figure 3C:
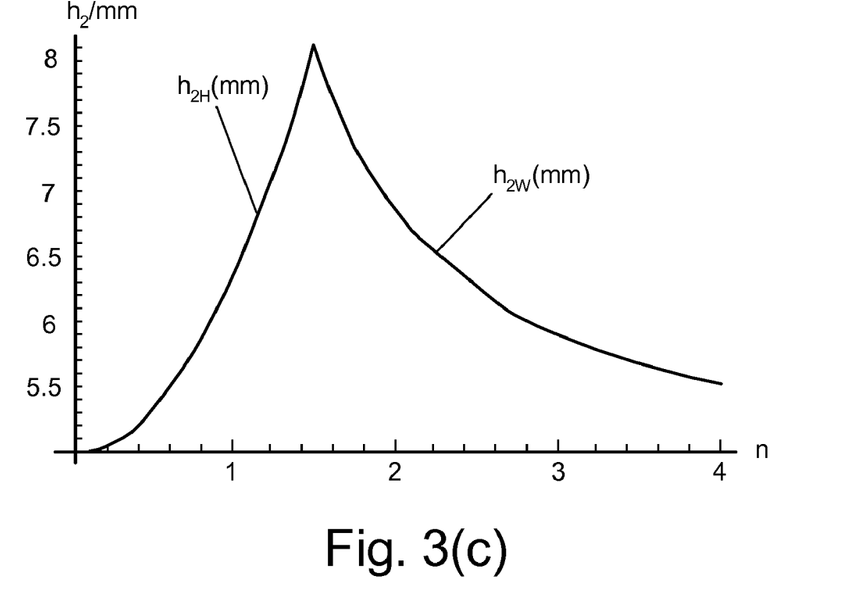

FIG. 3(b) plots $h_{2h}$ and $h_{2w}$ for Example 1, as a function of n, using $h_{2H}=h_{MAX2}/\sin\theta_2$ or $h_{2W}=h_1/\cos\theta_2$, $\theta_1=\theta$, $h_1=h_{MAX1}/\sin\theta_1$, and $\theta_2=90°-\theta_1$. FIG. 3(c) plots $h_2$ wherein $h_2=h_{2H}$ if $h_{2H}\leq h_{2W}$ and $h_2=h_{2W}$ if $h_{2H}>h_{2W}$.

Figure 3D:
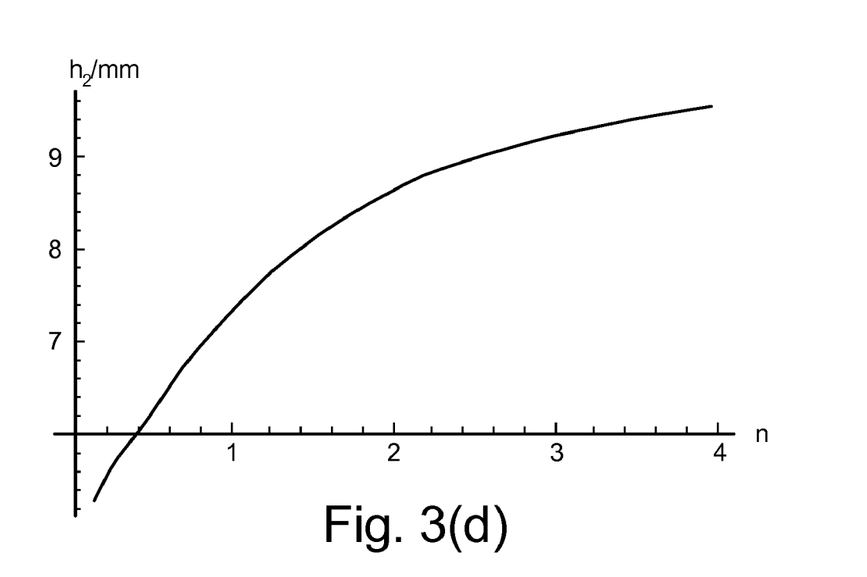

FIG. 3(d) plots the sample width $h_2$ mm for Example 2, wherein $h_{SMAX=hMAX1}\cos\theta - h_{MAX1}\sin^2\theta$ and $h_2=(h_{SMAX}+h_{MAX2})/\sin(90-\theta)$.

Process Steps

Figure 4:
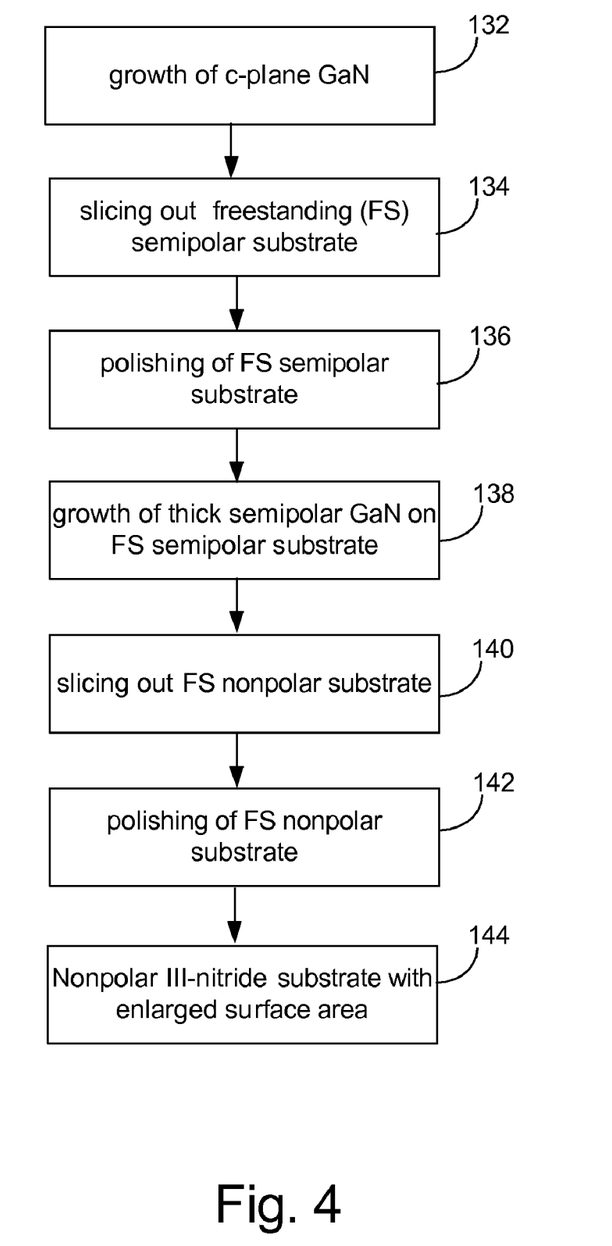
FIG. 4 is a flowchart illustrating the method of the present invention.

FIG. 4 is a flowchart illustrating the method of the present invention. For the area enlargement of FS GaN, a thick film of on-axis c-plane (0001) GaN 100 is first grown on a substrate 102, as shown in Block 132. A FS on-axis or miscut semipolar GaN substrate 106 is sliced out from the thick c-GaN film 100 at an angle $\theta_1$, as shown in Block 134, then polished for the semipolar plane growth, as shown in Block 136. Secondly, a thick film of semipolar GaN 108 is grown on the FS semipolar GaN substrate 106 described above, as shown in Block 138. A FS on-axis or miscut nonpolar GaN substrate 104 is sliced out from the thick semipolar GaN film 108 (or 108 and 106) at an angle $\theta_2$ (to produce m-plane at this step, $\theta_1+\theta_2=90°$ should be satisfied), as shown in Block 140, then polished to yield an epi-ready surface 128, as shown in Block 142. Block 144 illustrates the end result of the method, which is a nonpolar III-nitride substrate 104 with an enlarged surface area 128. Although c-plane GaN 100 has been chosen as a starting film here, other crystal planes 116a for the starting film 100 are also possible. In such cases, the number of process repeats of the growth/slice/polish sequence, and the angles (e.g. $\theta_1$, $\theta_2$) of slice steps must be changed accordingly, depending on the desired crystallographic orientation 146 of the surface 128. For example, Block 138 might involve growth of a nonpolar GaN and Block 140 might involve slicing out a semipolar substrate, with $\theta_1$, $\theta_2$ chosen accordingly. Therefore, a sum of the first angle $\theta_1$ and the second angle $\theta_2$ may determine a crystallographic orientation 146 of the top surface 128. The III-nitride 104, having thickness 148, may be sliced out of the III-nitride 106, 108 to become an FS substrate.

Possible Modifications and Variations

The scope of this invention covers more than just the particular examples listed above. This present invention is pertinent to all nitrides. For example, the present invention could enlarge the area of AlN, InN, AlGaN, InGaN, or AlInN FS substrates with reduced defect densities. These examples and other possibilities still incur all of the benefits of the present invention.

The process steps described above are only a description of one set of conditions that are expected to be useful for one way of applying the present invention to the geometrical area enlargement of FS GaN. There are other possible slice angles that could effectively enlarge the final non c-plane area 128. It is also possible to achieve the area enlargement of the final crystal plane 128 using multiple growth steps on multiple crystal planes, all of which will generate a large area and defect reduced FS nonpolar or semipolar GaN substrate 104. Nonpolar or semipolar device layers, such as n-type layers, p-type layers, laser, light emitting diode or transistor active layers, may be grown on the surface 128 of substrate 104, for example.

A thickness $h_{MAX2}$ of the nonpolar or semipolar III-nitride 108 may be thicker than a thickness of a commercially available III-nitride substrate.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for fabricating a nonpolar or semipolar III-nitride substrate with increased surface area, comprising:
   (a) growing III-nitride in a semipolar direction on a semipolar surface of a freestanding (FS) III-nitride substrate; and
   (b) slicing or polishing the III-nitride along a nonpolar plane to obtain a top surface of the III-nitride that is a nonpolar surface suitable for subsequent growth of the III-nitride in a nonpolar direction, wherein the sliced or polished III-nitride is a nonpolar III-nitride substrate.

2. The method of claim 1, wherein the slicing or polishing step results in a nonpolar III-nitride substrate including the III-nitride stacked on the FS III-nitride substrate.

3. The method of claim 1, wherein:
   (1) the semipolar surface is a sliced surface of the FS III-nitride substrate,
   (2) the sliced surface is at a first angle with respect to a c-plane and determines a growth direction of the III-nitride, and
   (3) a width of the sliced surface is a thickness of the FS III-nitride substrate divided by a sine of the first angle.

4. The method of claim 3, wherein the FS III-nitride substrate is sliced at the first angle out of FS III-nitride, the FS III-nitride has a c-orientation and the c-plane is a surface of the FS III-nitride.

5. The method of claim 3, wherein the nonpolar plane is at a second angle with respect to the semipolar plane.

6. The method of claim 5, wherein a sum of the first angle and the second angle is selected to determine a crystallographic orientation of the top surface of the III-nitride.

7. The method of claim 6, wherein the sum is 90 degrees.

8. The method of claim 3, wherein the nonpolar surface is a nonpolar plane and the growth direction is non-orthogonal to the c-plane in order to enlarge a surface area of the nonpolar surface as compared to a surface area of a nonpolar surface that is orthogonal to the c-plane.

9. The method of claim 8, wherein the nonpolar surface is $2h_{MAX2}$ times larger than the surface area of the nonpolar surface that is orthogonal to the c-plane, and $h_{MAX2}$ is a thickness of the III-nitride.

10. The method of claim 1, wherein the nonpolar surface is non-orthogonal to the semipolar surface, in order to enlarge the surface area of the nonpolar surface as compared to the surface area of the semipolar surface.

11. A device fabricated using the method of claim 1.

12. A nonpolar III-nitride substrate with increased surface area fabricated using the method of claim 1, wherein the nonpolar III-nitride substrate has a thickness of more than 500 microns.

13. A method for fabricating a semipolar III-nitride substrate with increased surface area, comprising:
   (a) growing III-nitride in a nonpolar direction on a nonpolar surface of a freestanding (FS) III-nitride substrate; and
   (b) slicing or polishing the III-nitride along a semipolar plane to obtain a top surface of the III-nitride that is a semipolar surface suitable for subsequent growth of the III-nitride in a semipolar direction, wherein the sliced or polished III-nitride is a semipolar III-nitride substrate.

14. The method of claim 13, wherein the slicing or polishing step results in a semipolar III-nitride substrate including the III-nitride stacked on the FS III-nitride substrate.

15. The method of claim 13, wherein:
   (1) the nonpolar surface is a sliced surface of the FS III-nitride substrate,
   (2) the sliced surface is at a first angle with respect to a c-plane and determines a growth direction of the III-nitride, and
   (3) a width of the sliced surface is a thickness of the FS III-nitride substrate divided by a sine of the first angle.

16. The method of claim 15, wherein the FS III-nitride substrate is sliced at the first angle out of FS III-nitride, the FS III-nitride has a c-orientation and the c-plane is a surface of the FS III-nitride.

17. The method of claim 15, wherein the semipolar plane is at a second angle with respect to the nonpolar plane.

18. The method of claim 17, wherein a sum of the first angle and the second angle is selected to determine a crystallographic orientation of the top surface of the III-nitride.

19. The method of claim 18, wherein the sum is 90 degrees.

20. The method of claim 15, wherein the semipolar surface is a semipolar plane and the growth direction is orthogonal to the c-plane in order to enlarge a surface area of the semipolar surface as compared to a surface area of a semipolar surface that is non-orthogonal to the c-plane.

21. The method of claim 20, wherein the semipolar surface is $2h_{MAX2}$ times larger than the surface area of the semipolar surface that is non-orthogonal to the c-plane, and $h_{MAX2}$ is a thickness of the III-nitride.

22. The method of claim 13 wherein the semipolar surface is non-orthogonal to the nonpolar surface, in order to enlarge the surface area of the semipolar surface as compared to the surface area of the nonpolar surface.

23. A device fabricated using the method of claim 13.

24. A semipolar III-nitride substrate with increased surface area fabricated using the method of claim 13, wherein the semipolar III-nitride substrate has a thickness of more than 500 microns.

* * * * *